(12) United States Patent
Muralidhar et al.

(10) Patent No.: US 6,320,784 B1
(45) Date of Patent: Nov. 20, 2001

(54) MEMORY CELL AND METHOD FOR PROGRAMMING THEREOF

(75) Inventors: Ramachandran Muralidhar; Sucharita Madhukar; Bo Jiang, all of Austin; Bruce E. White, Round Rock; Srikanth B. Samavedam, Austin; David L. O'Meara, Austin; Michael Alan Sadd, Austin, all of TX (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/524,916

(22) Filed: Mar. 14, 2000

(51) Int. Cl.$^7$ .................................................. G11C 11/00
(52) U.S. Cl. .................................... 365/151; 365/182
(58) Field of Search ............................ 365/151, 174, 365/182, 129

(56) References Cited

U.S. PATENT DOCUMENTS

| | | | |
|---|---|---|---|
| 4,881,108 | * 11/1989 | Yoshikawa | 257/324 |
| 5,272,372 | * 12/1993 | Kuzuhara et al. | 257/608 |
| 5,446,286 | * 8/1995 | Bhargava | 250/361 R |
| 5,714,766 | 2/1998 | Chen et al. | 257/17 |
| 6,159,620 | * 12/2000 | Heath et al. | 428/615 |

OTHER PUBLICATIONS

Sandip Tiwari et al., "Volatile and Non–Volatile Memories in Silicon with Nano–Crystal Storage", 1995 IEDM/IEEE, pp. 20.4.1 thru 20.4.4.
Sandip Tiwari et al, "A silicon nanocrystals based memory", Mar. 4, 1996 American Institute of Physical, vol. 68, No. 10, pp. 1377–1379.

* cited by examiner

Primary Examiner—David Nelms
Assistant Examiner—Hoai V. Ho
(74) Attorney, Agent, or Firm—Robert A. Rodriguez

(57) ABSTRACT

A memory cell (101), its method of formation, and operation are disclosed. In accordance with one embodiment, the memory cell (101) comprises a first and second current carrying electrode (12) a control electrode (19), and doped discontinuous storage elements (17). In accordance with an alternative embodiment, memory cell programming is accomplished by removing or adding an average of approximately at least a first charge (30, 62, 64), which can be electron(s) or hole(s) from each of the doped discontinuous storage elements (17).

14 Claims, 2 Drawing Sheets

MEMORY CELL AND METHOD FOR PROGRAMMING THEREOF

FIELD OF THE INVENTION

The present invention relates generally to semiconductor devices and more particularly to semiconductor device memory cells.

RELATED ART

As semiconductor scaling continues, integration problems are encountered which can affect the performance and reliability of semiconductor devices. For non-volatile memory (NVM) devices, such as electrically erasable programmable random access memories (E$^2$PROMs) these can include leakage or loss of the charge stored in the memory cell's floating gate from thinning of the device's tunnel oxide.

Quantum dot (nanocrystal) technology is an area currently under investigation as a replacement for conventional floating gates in scaled NVM devices. One specific application uses singularly isolated silicon nanocrystals as discrete storage elements to store the charge in the floating gate. The isolated nature of each of the nanocrystals reduces the floating gate's vulnerability to charge leakage that results from defects in the underlying tunnel oxide. Instead of providing a leakage path for the entire floating gate, the defect(s) provide a leakage path only for individually charged nanocrystals. Typically, the charge leakage from a single nanocrystal will not affect the overall charge associated with the floating gate.

The charge on the floating gate nanocrystals can be used to regulate the conductivity of the underlying channel in the NVM semiconductor device. The two states of the nanocrystal floating gate, which include nanocrystals uncharged and nanocrystals charged to an average uniform density (in electrons per nanocrystal) can be distinguished by the observed conductivity change in the memory's channel which manifests itself as a threshold voltage ($V_T$) shift.

Two important device parameters for NVM nanocrystal floating gates include the $V_T$ shift magnitude and the charge retention time. The $V_T$ shift magnitude between the uncharged state and the charged state depends on the average number of electrons injected per nanocrystal during the write operation. The greater the average number of electrons stored, the greater the $V_T$ shift. Moreover, a corresponding ability to detect the $V_T$ shift also increases with the number of electrons stored in the nanocrystal.

However, coulomb repulsion effects can be significant in nanocrystals, and coulomb charging energy can limit injection of electrons into the nanocrystal. For a given write operation pulse, there is a saturation of the number of electrons that are accommodated in the nanocrystal. As soon as a first electron is injected into the nanocrystal, subsequently injected electrons encounter coulombic repulsion from the negatively charged nanocrystal and tend to leak out. Thus, the retention time of the subsequently injected electron(s) is reduced. Therefore, at a given tunnel oxide thickness, the prior art is incapable of increasing a nanocrystal's $V_T$ shift without adversely affecting the charge retention time associated with the nanocrystal.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

A memory cell, its method of formation and operation are disclosed. In accordance with one embodiment, the memory cell comprises a first current carrying electrode, a second current carrying electrode, a control electrode, and doped discontinuous storage elements. In accordance with an alternative embodiment, memory cell programming is accomplished by removing or adding an average of approximately at least a first charge (electron(s) or hole(s)) from each of the doped discontinuous storage elements.

Figure 1:
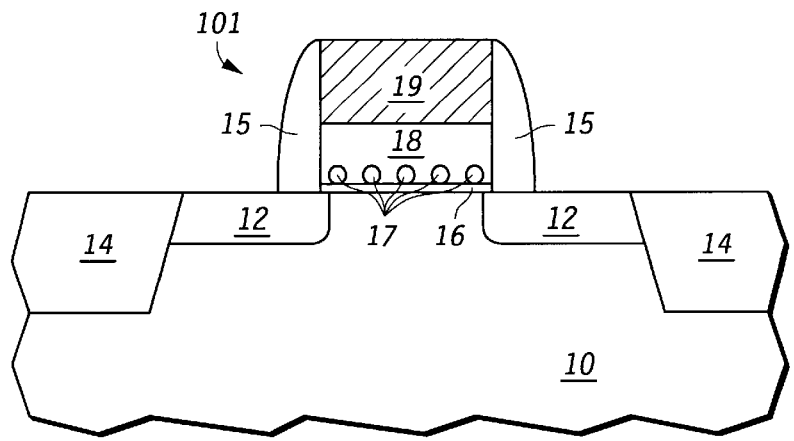
FIG. 1 includes a cross sectional view of a non-volatile memory device that includes doped floating gate nanocrystals.

Embodiments of the present invention will now be discussed with reference to the accompanying figures. FIG. 1 illustrates a cross-sectional view of an embodiment of the present invention that includes a NVM E$^2$PROM semiconductor device 101. The semiconductor device 101 is between isolation regions 14 and portions of it formed within a semiconductor substrate 10. The semiconductor device 101 includes source and drain regions 12, a tunnel dielectric 16, a floating gate comprised of doped nanocrystals 17, a control dielectric 18, a control electrode 19, and spacers 15.

In accordance with one embodiment, the semiconductor substrate 10 is a monocrystalline silicon substrate. Alternatively, the semiconductor substrate can include a silicon-on-insulator substrate, or any other substrate used in the manufacture of semiconductor devices. The isolation regions 14 provide electrical isolation to active regions of the semiconductor substrate and are formed using conventional methods, which can include shallow trench isolation (STI), local oxidation of silicon (LOCOS), buffered poly LOCOS, or the like.

A sequence of processing steps will now be discussed that describe in detail the formation of the semiconductor device 101, shown in FIG. 1. The tunnel dielectric 16 is initially formed as a tunnel dielectric layer overlying the semiconductor substrate 10. The tunnel dielectric layer typically includes a dielectric material, such as silicon dioxide ($SiO_2$). Alternative dielectric materials can include silicon nitride, hafnium oxide ($HfO_2$), zirconium oxide ($ZrO_2$), tantalum pentoxide ($Ta_2O_5$), or the like. In accordance with one embodiment, a $SiO_2$ tunnel dielectric layer is formed using a conventional thermal oxidation process. Alternative deposition methods can be used depending on the dielectric material being deposited. These deposition methods can include chemical vapor deposition (CVD), atomic layer deposition (ALD), or the like. Chemical vapor deposition processes as used herein can refer to low pressure CVD (LPCVD), atmospheric pressure CVD (APCVD), plasma enhanced CVD (PECVD) or the like. In one specific embodiment, the thickness of the $SiO_2$ tunnel dielectric layer is approximately 3.0 nanometers (nm). Typically, the tunnel dielectric layer has a silicon dioxide or an electrical equivalent oxide thickness (EOT) in a range of approximately 1.0–7.0 nm. For the purposes of this specification, the electrical equivalent oxide thickness refers to the thickness of a dielectric scaled by the ratio of its dielectric constant to the dielectric constant of silicon dioxide (silicon dioxide having a dielectric constant of approximately 3.9).

Overlying the tunnel dielectric 16 are doped nanocrystals 17. In accordance with one embodiment, the doped nanocrystals 17 can be formed by first depositing an amorphous layer of a semiconductor material, such as amorphous silicon, over the tunnel dielectric layer. The amorphous silicon layer can be deposited using a conventional CVD process. In one specific embodiment, the thickness of the deposited amorphous silicon layer is approximately 1.0 nm. Typically, the thickness of the deposited amorphous silicon layer is in range of approximately 0.5–1.5 nm. In alternative embodiments the amorphous laver can be formed using other materials, such a germanium, gallium arsenide, aluminum gallium arsenide, silicon carbide, silicon nitride, or the like.

The amorphous silicon layer can be doped with impurities by a variety of methods, such as in-situ CVD doping during deposition of the amorphous silicon layer or using ion-implantation after depositing the amorphous silicon layer. Dopant species (i.e. impurities) can include Group V (n-type) dopants, such as phosphorus, arsenic, antimony or the like, or Group III (p-type) dopants such as boron, indium, gallium, or the like depending on the type of charge (i.e. electron or hole) used to program the floating gate. In accordance with one embodiment, the amorphous silicon layer is doped with dopant species at a concentration that produces an average of at least one dopant atom for every subsequently formed nanocrystal. In one specific embodiment, the amorphous silicon layer is doped with phosphorus at a concentration of approximately $10^{19}$ $cm^{-3}$ or, alternatively, a dose of approximately $10^{12}$ phosphorus atoms/$cm^2$.

After depositing the doped amorphous silicon layer, the substrate is annealed to form the doped nanocrystals 17. In accordance with one embodiment, the anneal includes a two step annealing process. The substrate is first annealed using a rapid thermal annealing (RTA) process at a temperature in a range of 700–900 degrees Celsius for approximately 5–15 seconds to promote formation of silicon crystal nuclei in the amorphous silicon layer. The substrate is then annealed again using a furnace annealing process at a temperature in a range of approximately 600–800 degrees Celsius for approximately one hour. The furnace anneal promotes separation of the amorphous silicon layer and subsequent growth of individual isolated nanocrystals 17. The isolated nanocrystals have diameters that typically range from approximately 4.0–6.0 nm and average approximately 5.0 nm. In addition, the space separating the isolated nanocrystals typically ranges from approximately 4.0–6.0 nm and averages approximately 5.0 nm. The resulting doped nanocrystals have a density that is approximately 1E12 nanocrystals/$cm^2$ overlying the tunnel oxide. Thus, the density of nanocrystals (1E12 nanocrystals/$cm^2$) approximates the dose (1E12) of the phosphorus species in the amorphous silicon layer prior to anneal. Therefore, after performing the furnace annealing process, there is on average, approximately one phosphorus dopant atom per nanocrystal 17.

After forming the doped nanocrystals 17, a control dielectric layer that will subsequently form the control dielectric 18 is formed over the nanocrystals 17. In accordance with one embodiment, the control dielectric layer is an undoped CVD deposited oxide layer. Alternatively, the control dielectric layer can be formed using other deposition processes, and can include other dielectric materials or combinations of dielectric materials, such as an oxide-nitride-oxide (ONO) film stack, or the like. The formation of the control dielectric is considered conventional to one of ordinary skill in the art. Typically, the thickness of the control dielectric is in a range of approximately 5.0–20.0 nm. More typically the thickness of the control dielectric is in a range of approximately 5.0–10.0 nm. In one specific embodiment the thickness of the control dielectric is approximately 10.0 nm.

Formed overlying the control dielectric layer is a control gate layer that is subsequently used to form the control gate 19. In accordance with one embodiment, the control gate layer is a CVD deposited polysilicon layer. The polysilicon layer can be doped in-situ with a p-type dopant (or an n-type dopant depending of the type of semiconductor device formed) or, if desired, during subsequent processing using ion implantation. In addition, subsequent processing can optionally include salicidation of the polysilicon. The control gate layer thickness is typically in a range of approximately 150–700 nm.

After depositing the control gate layer, the substrate is patterned with resist and etched to form the film stack shown in FIG. 1. In accordance with one embodiment, the patterned film stack is etched using a conventional silicon reactive ion etch (RIE) process to remove the unpatterned portions of control gate layer 19 and expose the control oxide layer 18. A portion of the control gate dielectric layer overlying the nanocrystals may also removed during this process. The resist layer is then removed and the substrate 10 is processed through a polysilicon reoxidation process. This process involves heating the substrate to a temperature between approximately 800 C and 900 C in an oxygen ambient and results in the growth of approximately 10.0 nm of silicon dioxide on the polysilicon control gate. The polysilicon reoxidation process converts the silicon nanocrystals that are exposed to the ambient environment (i.e. not positioned between the control gate and the tunnel oxide to silicon dioxide). Then, the remaining control oxide layer 18, the oxidized nanocrystals, and the tunnel oxide 16 are removed using a conventional oxide etch process.

In an alternative embodiment, it may not be necessary to oxidize (or remove) the nanocrystals from the unpatterned areas, in which case the extent of polysilicon reoxidation may be reduced such that the amount of silicon dioxide formed on the polysilicon control gate is approximately 4.0 nm. This thickness is consistent with values typically found in a conventional complimentary metal oxide semiconductor (CMOS) process After etching the unpatterned control gate portions, the control dielectric and the tunnel dielectric are removed using a conventional dielectric etch process. In this embodiment, the etch selectivity of the nanocrystals to the dielectric materials may be sufficient to remove the nanocrystals. On the other hand, the presence of residual nanocrystals may be acceptable in terms of the reliability and performance of the semiconductor device.

After forming the patterned film stack that includes remaining portions of control gate 19, the control dielectric 18, the nanocrystals 17, and the tunnel dielectric 16, spacers 15 and source/drain regions are formed to produce the semiconductor device 101 shown in FIG. 1. The spacer formation and the source/drain region formation are considered conventional to one of ordinary skill in the art. Although not specifically illustrated in FIG. 1, the substrate can subsequently be processed using conventional method to form interlevel dielectric (ILD) layers, interconnects, and additional device circuitry that can be used in conjunction with the semiconductor device 101. The doped silicon nanocrystals 17, shown in FIG. 1 can be used advantageously to increase the overall charge and $V_T$ shift associated with the nanocrystal without encountering the coulombic repulsion problems that negatively impact the charge retention time of prior art memory cells having undoped nanocrystals. This and other advantages will become apparent during the following discussion with reference to FIGS. 2–6.

Figure 2:
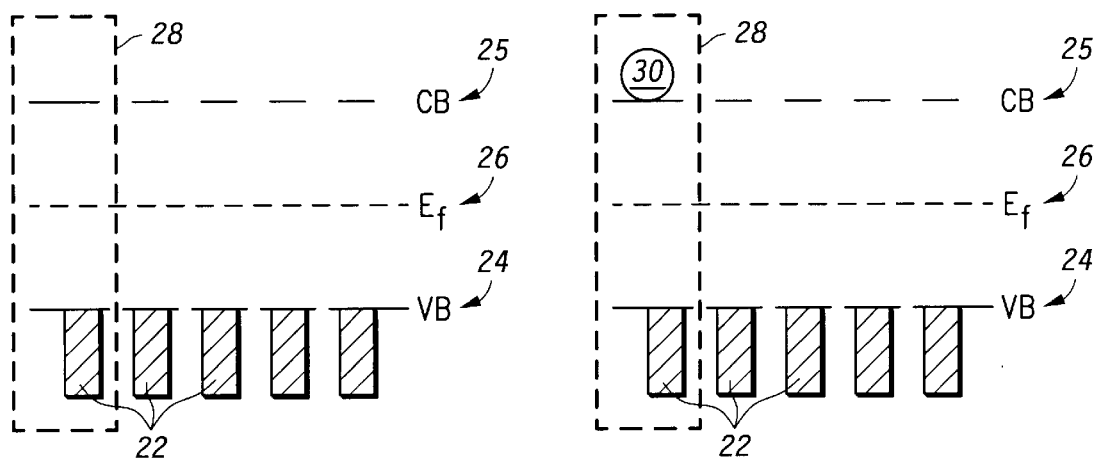
FIG. 2 includes an illustration of a band model energy diagram of prior art intrinsic (undoped) nanocrystals.

FIG. 2 includes an illustration of a band model energy diagram for silicon nanocrystals used by a prior art floating gate. Each valance band (VB) 24 dash and its associated conduction band (CB) 25 dash are representative of an individual nanocrystal in the floating gate. The Fermi energy band ($E_f$) 26 is positioned between the conduction band 25 and valance band 24 of the nanocrystals. The hatched regions 22 associated with each of the nanocrystal valance bands 24 indicate that the valance bands are completely full of electrons. The outlined element 28 corresponds a single nanocrystal in the floating gate. Although the injection and removal of electrons (or holes) in FIGS. 2–6 will be discussed with respect to a single nanocrystal, one of ordinary skill in the art recognizes that a single nanocrystal is being used for illustrative purposes; and that other nanocrystals in the floating gate will behave similarly when appropriate biasing conditions are applied. As illustrated in FIG. 2, no electrons have been added to the conduction band for any of the nanocrystals. Therefore a neutral electrical charge is associated with each nanocrystal (and the floating gate). The band model energy state illustrated in FIG. 2 is uncharged and could correspond to an erase programmed state in a prior art floating gate.

Figure 3:
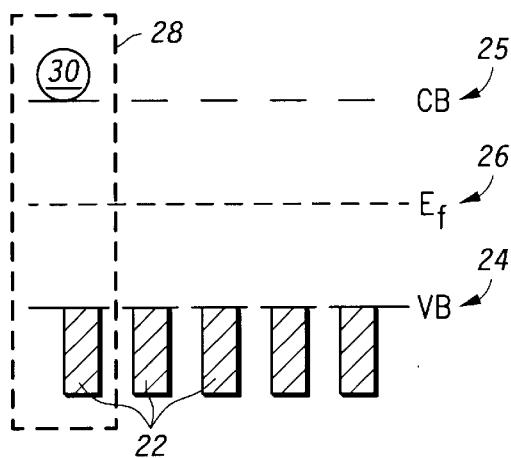
FIG. 3 includes an illustration of the band model energy diagram shown in FIG. 2 after injecting an electron into a nanocrystal.

FIG. 3 illustrates the band model energy diagram shown FIG. 2 and additionally shows that nanocrystal 28 has been programmed and now includes an electron 30 in the conduction band 25 of the nanocrystal 28. The electron 30 can be added to the floating gate's nanocrystals by forward biasing the memory cells control gate thereby injecting electrons from the inverted channel region of a memory cell, through the tunnel dielectric, and into the conduction band of each of the nanocrystals The presence of the charge associated with the additional electron produces a stored charge that reduces conduction in the inverted channel (i.e. increases the $V_T$ of the memory cell). The floating gate's nanocrystals can similarly be deprogrammed by removing the charge stored from the nanocrystal by reverse biasing the control gate such that the energy at the channel surface is lowered with respect to the control gate allowing the electron to tunnel back into the substrate.

An average of one stored electron per nanocrystal equates to a threshold voltage shift of approximately 0.3–0.7 volts for a floating gate having a nanocrystal density of approximately 1E12 $cm^{-2}$ and a control dielectric thickness of approximately 5.0–10.0 nm. However, the charge associated with the stored electrons produces coulombic repulsion effects. These effects make the injection of additional electrons into each of the nanocrystals problematic and can limit the magnitude of the threshold voltage shift of the semiconductor device.

Figure 4:
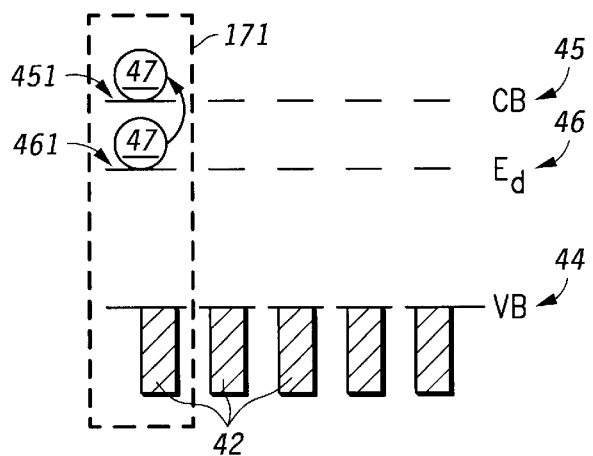
FIG. 4 includes an illustration of an energy band diagram showing excitation of an electron from the doner energy band to the conduction band of a doped nanocrystal.
Figure 5:
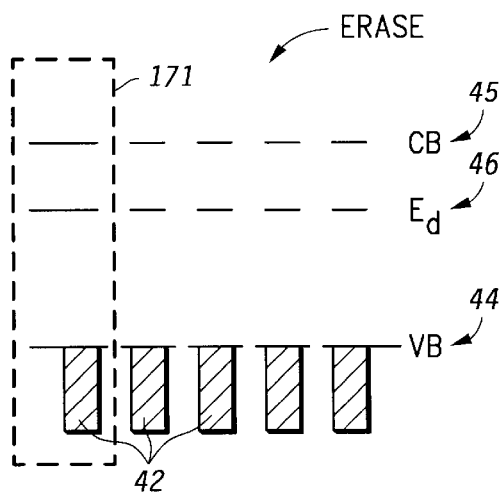
FIG. 5 includes an illustration showing an energy band diagram of the doped nanocrystal shown in FIG. 4 after an erase operation.
Figure 6:
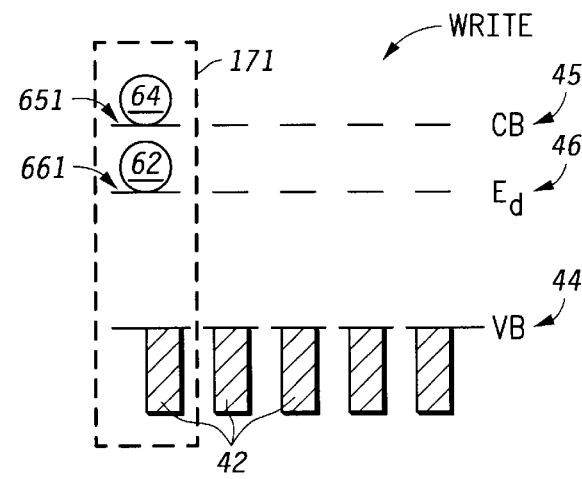
FIG. 6 includes an illustration showing an energy band diagram of the doped nanocrystal shown in FIG. 5 after a write operation.

The present invention, which uses doped nanocrystals overcomes the limitations of the prior art nanocrystals. The present inventors have found that doped nanocrystals can advantageously be used to increase the threshold voltage shift of the floating gate without encountering coulombic repulsion affects associated with the prior art nanocrystals. FIGS. 4–6 include band model energy diagrams illustrating an embodiment of the present invention. Specifically FIGS. 4–6 illustrate the behavior of electrons in nanocrystals doped with approximately one dopant atom per nanocrystal during erase and write operations of the floating gate that includes the nanocrystals 17 shown in FIG. 1. Although, the specific programming and movement of electrons shown in FIGS. 4–6 are with respect to a single doped nanocrystal 171, one of ordinary skill in the art recognizes that approximately each of the doped nanocrystals in the floating gate 17 will respond similarly to doped nanocrystal 171 under the appropriate biasing conditions.

FIG. 4 illustrates a band model energy diagram in which an electron contributed by n-type dopant changes from an initial donor energy state $E_d$ into the conduction band CB of a nanocrystal 171. Included in FIG. 4 are valence bands 44 and their associated conduction bands 45 for other individual nanocrystals in the floating gate. Associated with each nanocrystal is an energy level $E_d$, which is allowed for by the presence of the n-type dopant atom in the silicon nanocrystals. Initially, the electron 47 associated with the n-type dopant is loosely bound to the dopant atom in the energy level $E_d$. However, it is easily and quickly excited into the conduction band CB, as illustrated by the transition of electron 47 from position 461 to position 451 in FIG. 4. After reaching the conduction band, the electron is free to move between individual silicon atoms in the nanocrystal (not shown). However, despite the presence of the electron, unlike the prior art, the nanocrystal remains in a state of electrical neutrality.

FIG. 5 illustrates that the electron 47 shown with respect to FIG. 4 has been removed from the conduction band CB of the nanocrystal 171. In accordance with one embodiment of the present invention, this corresponds to an erase operation of the nanocrystal in the floating gate. The removal of the electron is accomplished by biasing one or both of the control gate 19 and the source/drain regions (current carrying electrodes) 12 shown in FIG. 1, such that the energy at the channel surface is lowered with respect to the control gate, for example, by applying a potential difference of approximately negative 3 to negative 5 volts between the control gate and the substrate. After erasing, the conduction band 45 and the dopant energy level 46 are void of electrons and the valance band 44 is full, as shown in FIG. 5. The net charge of the nanocrystal 171 is positive due to the positively charged donor state.

In accordance with one embodiment, a write operation to the memory cell's floating gate can be performed by injecting a first electron 62 and, optionally, a second electron 64 into the nanocrystal 171 by appropriately biasing the control gate relative to the channel. At the given tunnel dielectric thickness range, the threshold voltage shift increase associated with the addition of the electron is in a range 0.3–0.7 volts. The first injected electron can replace the electron originally supplied by the dopant atom in the nanocrystal in FIG. 4. The electron can reside either in either the dopant energy level position 661 or the conduction band position 651. After the first electron is injected into the nanocrystal, the charge associated with the nanocrystal is substantially neutral.

The second electron 64 can then be introduced into the nanocrystal by appropriately biasing the control gate. The first electron 62 and the second electron 64 can be injected as part of a single programming operation or as discrete programming operations. This can be accomplished by either controlling the program time at a fixed programming voltage or by varying the programming voltage at a fixed programming time or a combination of the two methods. Unlike the prior art memory cell, however, the second electron is being injected into a neutrally charged nanocrystal and is therefore not subjected to the coulombic blockade effects associated with prior art nanocrystals. Thus, the second electron 64 can be injected into the nanocrystal without experiencing the leakage problems experienced by prior art floating gates. The second injected electron 64 can reside in either the dopant energy level 46 (if unoccupied) or in the conduction band 45. The additional threshold voltage shift increase associated with the second injected electron to will be in a range 0.3–0.7 volts. The combined total threshold voltage shift in the floating gate is, therefore, the result of the contribution of two electrons per nanocrystal and is in a range of approximately 0.6–1.4 volts. The net charge associated with the nanocrystals after the electron is added is negative.

During subsequent operations, the control gate/substrate can be biased to remove one or both of the stored electrons or to replace the removed electrons in the nanocrystal. The present invention can be readily extended to include the use of p-type dopants (holes) to create the charge in the memory cell's floating gate. In such embodiments the floating gate is doped with a p-type dopant, for example, boron, and the resulting hole contributes to a charge in the nanocrystals valence band. In addition, these embodiments can also be extended to include doubly ionized dopant species, such as doubly ionized phosphorus or other dopants having multiple electrons or holes that could occupy energy states between the valence band and conduction band of the silicon nanocrystal (i.e. Group VIA, VIIA or Group IIB, IB dopants). The removal or addition of the charges associated with the dopants can be used discretely to program a multi-state memory or to increase the overall threshold voltage shift of the device.

Although the invention has been described with respect to specific conductivity types or polarity of potentials, skilled artisans appreciated that conductivity types and polarities of potentials may be reversed in accordance with alternative embodiments of the present invention. In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A memory cell comprising:

a first current carrying electrode, a second current carrying electrode, a control electrode, and discontinuous storage elements, wherein the discontinuous storage elements comprise nanocrystals doped with dopant atoms.

2. The memory cell of claim 1, wherein the discontinuous storage elements include a material selected from a group consisting of silicon, germanium, gallium arsenide, aluminum gallium arsenide, silicon carbide, and silicon nitride.

3. The memory cell of claim 1, wherein the dopant atoms are selected from a group consisting of phosphorus, boron, indium, and arsenic.

4. A method for programming a memory cell comprising:

providing a memory cell that includes:

a first current carrying electrode;

a second current carrying electrode;

a control electrode;

a plurality of discontinuous storage elements, wherein the discontinuous storage elements comprise nanocrystals doped with dopant atoms; and removing at least a first charge from the discontinuous storage elements wherein the at least the first charge contains a first polarity.

5. The method of claim 4, wherein removing at least the first charge is further characterized as an erase operation for a non-volatile memory cell.

6. The method of claim 4, further comprising injecting at least a second charge with the first polarity into the discontinuous storage elements.

7. The method of claim 6, wherein the injecting at least a second charge is further characterized as a write operation for a non-volatile memory.

8. The method of claim 6, wherein the injecting at least a second charge is further characterized as an erase operation for a non-volatile memory.

9. A method for programing a memory cell comprising:

providing a memory cell that includes:

a first current carrying electrode;

a second current carrying electrode;

a control electrode;

a plurality of discontinuous storage elements, wherein each of the discontinuous storage elements comprise a nanocrystal doped with at least one dopant atom; and adding at least a first charge to each of the plurality of discontinuous storage elements.

10. The method of claim 9 wherein the first charge is further characterized as an electron.

11. The method of claim 9 wherein the first charge is further characterized as a hole.

12. The method of claim 9, wherein adding the at least the first charge is further characterized as a write operation for a non-volatile memory cell.

13. The method of claim 9, further comprising removing at least one of the at least the first charge from the discontinuous storage elements.

14. The method of claim 13, wherein removing at least one of the at least the first charge from the discontinuous storage elements is further characterized as an erase operation for a non-volatile memory.

* * * * *